United States Patent [19]

Stormont et al.

[11] Patent Number: 4,544,528

[45] Date of Patent: Oct. 1, 1985

[54] APPARATUS FOR GROWING TUBULAR CRYSTALLINE BODIES

[75] Inventors: Richard W. Stormont, Warwick, R.I.; Lawrence Eriss, Arlington, Mass.

[73] Assignee: Mobil Solar Energy Corporation, Waltham, Mass.

[21] Appl. No.: 446,860

[22] Filed: Dec. 6, 1982

Related U.S. Application Data

[62] Division of Ser. No. 289,410, Aug. 3, 1982, Pat. No. 4,440,728.

[51] Int. Cl.$^4$ .............................................. C30B 15/34
[52] U.S. Cl. .............................. 422/246; 156/DIG. 73
[58] Field of Search ........ 422/246; 156/608, DIG. 73

[56] References Cited

U.S. PATENT DOCUMENTS

| 3,591,348 | 7/1971 | Belle, Jr. ............................... 156/608 |
| 4,230,674 | 10/1980 | Taylor et al. ................ 156/DIG. 83 |
| 4,271,129 | 6/1981 | Berkman et al. ...................... 422/246 |
| 4,390,505 | 6/1983 | Taylor et al. ......................... 422/246 |
| 4,415,401 | 11/1983 | Wald .................................... 156/608 |
| 4,416,723 | 11/1983 | Pelts et al. ............................ 156/608 |

Primary Examiner—Hiram H. Bernstein
Attorney, Agent, or Firm—Schiller & Pandiscio

[57] ABSTRACT

Apparatus for growing hollow tubular crystalline bodies from the melt includes, in a preferred embodiment, a capillary die of the desired shape, a seed holder having a cross section of similar shape and to which a plurality of elongate seeds may be attached, and an inner after heater of substantially similar shape but smaller size supported from the die by an inner radiation shield.

13 Claims, 3 Drawing Figures

APPARATUS FOR GROWING TUBULAR CRYSTALLINE BODIES

This application is a division of application Ser. No. 289,410, filed Aug. 3, 1982 (now U.S. Pat. No. 4,440,728).

The present invention relates to crystal growth and in particular to the fabrication of tubular bodies of semiconductor materials for use in forming solar cells and other solid state devices.

Various methods have been developed for growing crystalline bodies from the melt. The present invention involves growing crystalline bodies from a melt according to what is called the edge-defined, film-fed growth technique (also known as the EFG process). Details of this process are described, e.g., in U.S. Pat. No. 3,591,348, issued to Harold E. LaBelle, Jr. By this process it is possible to grow crystalline bodies of silicon or other material in diverse shapes such as round rods, tubes, and flat ribbons (as used herein, the terms "tube" and "tubular" are used in a generic sense to include elongate hollow bodies having a circular, polygonal, or other - e.g., elliptical - cross-sectional shape). The shape of the growing body is regulated by the form of one or more so-called capillary die members, each die having a face with edges so shaped as to control the surface of the die wetted by the melt by capillarity. It is also known (as disclosed, e.g., in U.S. Pat. No. 4,036,666, issued to A. I. Mlavsky and in U.S. Pat. No. 4,095,329, issued to K. V. Ravi) that large dimension tubular structures grown by the EFG process may be cut so as to provide ribbons of higher quality than ribbons produced directly by the EFG Process.

In greater detail, the EFG Process involves growth on a moving seed crystal from a liquid film of feed material sandwiched between the growing body and the skin surface of the capillary die. The feed material is replenished from the melt by capillary action as the seed crystal moves away from the die, drawing the film after it. The shape of the crystalline body formed is determined by the external or edge configuration of the end surface of the die, the edge delimiting the area of the die face wetted by the melt. Since the liquid film has no way of discriminating between an outside edge and an inside edge of the die's end surface, a continuous hole may be grown in the crystalline body by providing the end of the die with a hole of the same shape as the hole desired in the growing body, provided, however, that any such hole in the die must be made large enough so that surface tension will not cause the film around the hole to fill in over the hole.

The seed, which must be of similar material as the melt, need not have the same cross-sectional area and shape as the desired body. By appropriately controlling the pulling speed of the growing body and the temperature of the liquid film, the film can be made to spread (under the influence of the surface tension at its periphery) across the full expanse of the end surface of the die until it reaches the perimeters thereof. However, it will be appreciated in such cases the grown body will not be of uniform configuration in the direction of growth, the early growth conforming to the seed's configuration and the later growth assuming the configuration of the die. While this results in a lower yield of useful product, it may be tolerable, particularly in the case of bodies of small cross-section. However, for large cross-sections it is desirable that the seed closely approximate the body being grown, in order to maximize the yield. In manufacturing operations, this may be easily accomplished by using a section of a previously grown body as the seed for a later grown body. However, in growing tubular bodies an initial full size seed may not be obtainable from a previous EFG growth and in such cases it typically has been fabricated in the past by machining Czochralski-type boules. The latter approach is costly, especially in growing tubular bodies of relatively large cross sections, e.g., tubes with diameters of 3 to 6 inches. The problem is even further complicated by the preferred practice of including after-heaters opposite the solidifying film, both outside and inside the hollow growing body, in order to control the temperature march of the solidifying film. The apparatus is most easily realized by supporting the inner after heater from the die or crucible. Clearly, in such an arrangement the height of the seed must surpass the height of the inner after heater. With the advent of efforts to produce larger and larger EFG-grown crystals, it has become increasingly difficult and expensive to acquire Czochralski-type boules of the size required to provide suitable seeds. Further, large sized boules of some materials are virtually impossible to obtain.

Accordingly, it is an object of the present invention to provide an initial seed for use in EFG crystal growing which is a reasonable facsimile of a desired cross-section and which may be fabricated relatively inexpensively. Further, it is an object of the present invention to provide a method of fabricating such initial seeds that does not limit their size to that of obtainable boules.

These and other objects are achieved by the present invention in which the initial seed is fabricated from a plurality of individual seed members. Preferably, the separate seed members are in the form of ribbons attached to a holder so as to abut one another. The size and shape of the holder is made coincident with the desired size and shape of the grown form. It will be appreciated that this structure permits any hollow, e.g., polygonal, section to be built up from individual ribbon or chips.

Other objects of the invention will in part be obvious and will in part appear hereinafter. The invention accordingly comprises the apparatus possessing the construction, combination of elements, and arrangement of parts which are exemplified in the following detailed disclosure and the scope of the application of which will be indicated in the claims.

For a fuller understanding of the nature and objects of the present invention, reference should be had to the following detailed description taken in connection with the accompanying drawing wherein.

In the three views, like numbers refer to like members.

Figure 1:
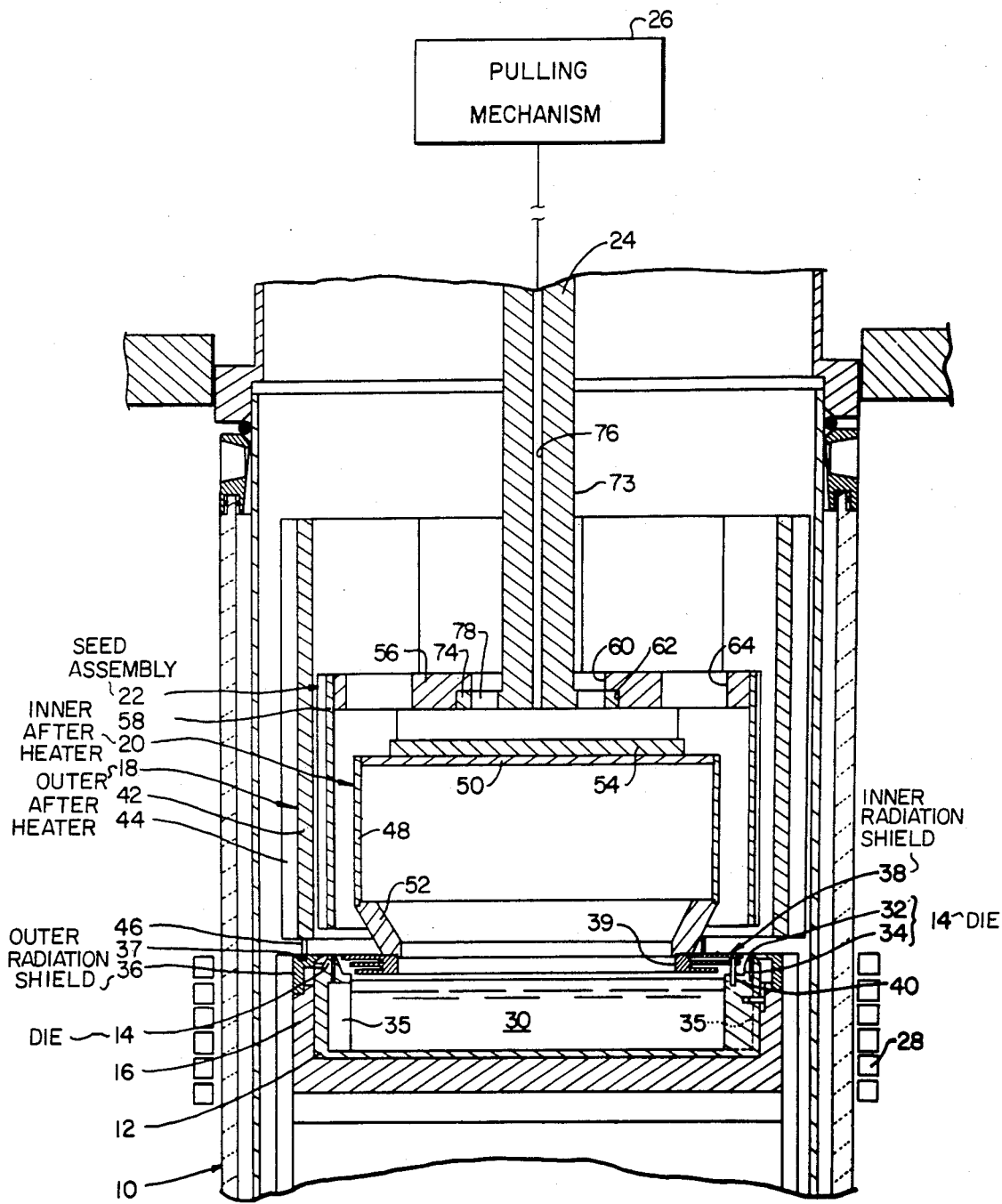
FIG. 1 is a fragmentary sectional elevation of a crystal growing furnace, with certain parts represented schematically, incorporating a preferred embodiment of the present invention.

Referring to FIG. 1, there may be seen an EFG crystal growing apparatus incorporating the present invention. The apparatus comprises a furnace enclosure 10, within which are disposed crucible 12, capillary die 14, susceptor 16, after-heater assemblies 18 and 20, and seed assembly 22. As will be described in detail hereinafter, seed assembly 22 is positioned and supported by stem 24 and pulling mechanism 26. Furnace enclosure 10 is surrounded by a radio-frequency heating coil 28 which is coupled to a controllable radio-frequency power supply (not shown) of conventional construction. In use, crucible 12 is loaded with a charge 30 of the material to be grown (e.g., silicon, alpha-alumina, and the like).

In greater detail, typically, but not necessarily, furnace enclosure 10 is fabricated from a pair of concentric spaced-apart cylindrical quartz tubes. Although not shown in detail, it will be understood that furnace enclosure 10 is closed top and bottom to permit the atmosphere within the enclosure to be controlled. Crucible 12 is a short, hollow, opentopped right prism or right circular cylinder centrally disposed within enclosure 10. In a preferred arrangement, shown in FIG. 1, capillary die 14 is an integral part of the sidewall of crucible 12, as detailed in U.S. Pat. No. 4,230,674. As is well known in the art, capillary die 14 is provided with an end face 32 shaped and dimensioned to control the form and size of the grown crystal. In a preferred embodiment, face 32 is in plan a hollow thin-walled regular polygon. End face 32 is further provided with a capillary gap 34 of similar form centered in the face. A plurality of elongate slots 35 are formed on the inside of the side wall of crucible 12 communicating between capillary gap 34 and the interior of the crucible so that the melted charge 30 may flow to the capillary gap wherein it may rise by capillary action to replinish the material on face 32 as the crystal is grown. It will be recognized by those skilled in the art that this is the arrangement of the embodiment illustrated in FIG. 6 of U.S. Pat. No. 4,230,674, although it will also be understood that die 14 could be formed partly by the crucible and partly by a separate structure, or it could be made as a completely separate structure. The material of construction of crucible 12 (and die 14) is chosen on the basis of the material to be grown. In a preferred embodiment, silicon is grown, and preferably crucible 12 and die 14 are formed of graphite and the seed is silicon. It will be understood, however, that for other applications other materials could be used, and in particular that crucible 12 and die 14 could be separate parts of differing composition. For the purposes of the present invention, it should also be understood that end face 32 of die 14 need not be in the form of a regular polygon in plan, or indeed polygonal, as long as it is in the form of a closed plane figure.

Susceptor 16 is typically a short hollow opentopped cylindrical or prismatic body dimensioned to accommodate crucible 12. The height of susceptor 16 is chosen to permit capillary die 14 to project upward beyond the top of the susceptor. Susceptor 16 is fabricated of a material such as molybdenum or graphite, the choice in part depending upon the available excitation frequency of heating coil 28 (e.g., preferably molybdenum for frequencies in the vicinity of 10 KHz and graphite for frequencies in the vicinity of 450 KHz) and in part depending on the compatibilities of materials.

The top of susceptor 16 is provided with an outer radiation shield 36. Outer radiation shield 36 is in the form of a thin-walled hollow cylinder or prism of similar shape and outside dimension as susceptor 16 and with an interior flange 37 of similar form as end face 32 of capillary die 14. Outer radiation shield 36 is dimensioned and disposed such that flange 37 is substantially coplanar with but separated from end face 32. Outer radiation shield 36 is preferably fabricated of molybdenum. Mounted to the interior of capillary die 14 is inner radiation shield 38. Inner radiation shield 38 is formed of one or more graphite plates held together in parallel spaced apart opposing relationship. The outside dimension of inner radiation shield 38 is of similar form as and smaller than the plan of end face 32. Radiation shield 38 is provided with a central circular aperture 39 penetrating therethrough. In a preferred embodiment, inner radiation shield 38 is machined from a single piece of graphite, although it will be understood it could be fabricated from a number of sheets fastened together. Radiation shield 38 is supported in spaced-apart relationship from die 14 by a plurality of pins 40 disposed about the inner periphery of die 14.

After-heaters 18 and 20 are disposed above, and in concentric relation to, die end face 32. After-heater 18 is disposed outside the die face and after-heater 20, inside. After-heater 18 is of hollow, open ended right prismatic form, its base being similar to but larger than the plan of die end face 32. The corresponding faces of after-heater 18 are arranged parallel to the corresponding sides of the polygon formed by end face 32 and extend substantially normal to the plane of the end face. After-heater assembly 18 is a double walled structure, with a graphite interior wall 42 and an external carbon felt insulating wall 44. After-heater 18 is supported clear of flange 37 on outer radiation shield 36 by a plurality of pins 46.

Inner after-heater 20 includes cylindrical walls 48, top plate 50, and tapered section 52. Cylindrical section 48 is a thin-walled hollow graphite right circular cylinder of smaller outside diameter than the circle which can be inscribed within the plan of end face 32 of die 14. Preferably, top plate 50 is a circular graphite plate dimensioned to fit and close off one end of cylindrical section 48. Tapered section 52 is in the form of a hollow open ended conical frustum attached by its larger base to the other end of conical section 48. The smaller base of tapered section 52 is chosen to be of similar diameter as central aperature 39 in inner radiation shield 38. With the exception of the top of inner after-heater 20, the walls of each section are single. The top of inner after-heater 20 is of double walled construction, top plate 50 supporting a somewhat smaller diameter carbon felt insulation pad 54. Inner after-heater 20 is supported on the top of inner radiation shield 38 by tapered section 52 such that the interior of the after-heater communicates with the interior of crucible 12 through aperture 39 in the radiation shield. Cylindrical section 48 of the inner afterheater is disposed with its cylindrical axis substantially normal to the plane of end face 32.

Figure 2:
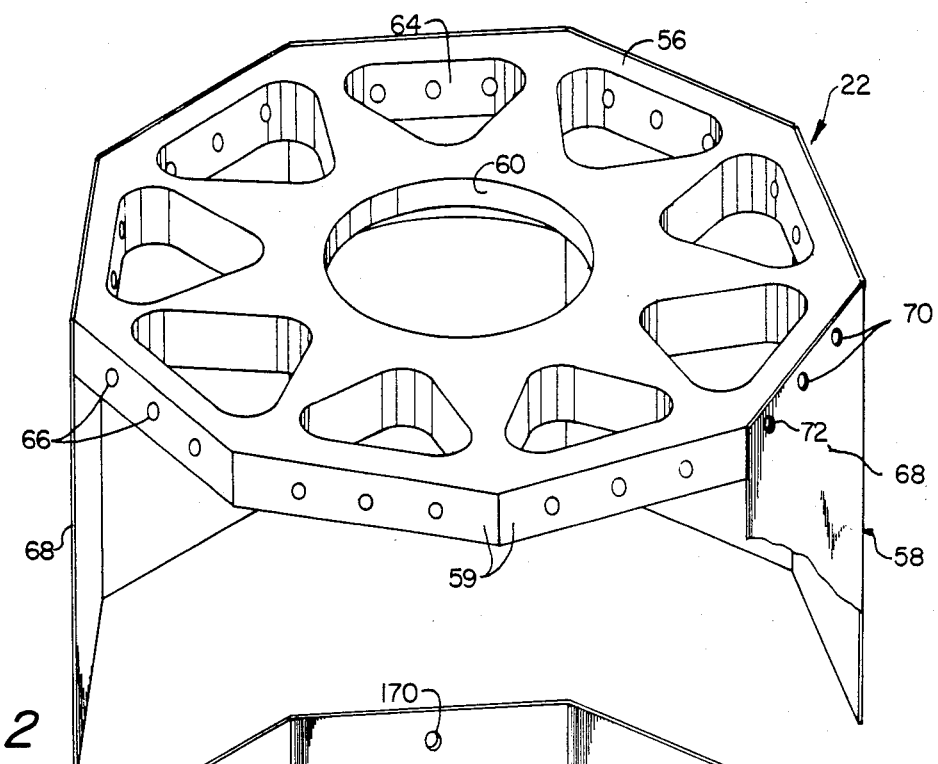
FIG. 2 is a perspective view of the seed holder of FIG. 1 with a partially assembled initial seed attached thereto.

The structural details of seed assembly 22 may best be seen by reference to FIG. 2. Seed assembly 22 comprises seed holder 56 and seed 58. Seed holder 56 is a plate, preferably of graphite of similar size and shape as the inside periphery of end face 32 of die 14. Seed holder 56 is provided with a central bore 60 passing through the seed holder. One end of central bore 60, best seen in FIG. 1, is provided with a counter bore 62. Referring again to FIG. 2, it may be seen that seed holder 56 is provided with a plurality of aperatures 64. In a preferred embodiment, each aperature 64 is roughly in the shape of an isosceles triangle, each arranged with its altitude substantially along the perpendicular bisector of one of the polygonal prism faces of seed holder 56.

An initial seed 58 may be formed from a plurality of substantially identical seed plates 68. Each plate 68 is a rectangular sheet or ribbon having a thickness on the order of, but typically somewhat greater than, the thickness of the desired grown crystal. The width of each plate 68 is chose to be the same dimension as one of the polygonal segments of face 32. The length of each plate 68 is chosen to be a greater than the overall height of inner after-heater 20 by a dimension in excess of the thickness of seed holder 56. Each plate 68 is provided with a plurality of aperatures 70 dimensioned and disposed so as to be aligned with threaded apertures 66 in the side of seed holder 56 when the plate 68 is positioned on a prismatic face 59 with a short edge coplanar with the upper face of seed holder 56 (i.e., the face of seed holder 56 opposite the face having counter bore 62). Each plate 68 may be secured to seed holder 56, as by graphite screws 72 passing through apertures 70 and threaded into threaded apertures 66.

Referring again to FIG. 1, stem 24 is in the form of an elongate cylindrical shaft 73 provided with an external flange 74 at one end. Shaft 73 is dimensioned to be substantially smaller than bore 60 of seed holder 56. Flange 74 is in the form of a flat concentric circular plate, and is dimensioned to smoothly fit within counter bore 62 of seed holder 56. Stem 24 is further provided with a coaxial bore 76 communicating throughout the entire length of the stem. Flange 74 is provided with a plurality of vent aperatures 78 disposed to be within the diameter of bore 60.

To assemble the apparatus, an initial polygonal seed is assembled from an appropriate number of plates 68 by securing each plate to seed holder 56 so that adjacent plates abut one another and all plates extend beyond the bottom of the seed holder (i.e., the side of the seed holder pierced by counterbore 62) by equal distances each greater than the overall height of inner after-heater 20. Rod 73 of stem 24 is passed through central bore 60 of seed holder 56 so that flange 74 may enter counter bore 62. The assembled seed may thus be supported by flange 74 resting within counter bore 62.

Initially, stem 24 is affixed by any of a number of conventional clamping means (not shown) to pulling mechanism 26, the whole being adjusted so as to support seed assembly 22 coaxial with, well clear of, and above inner after-heater 20, with individual plates 68 of the seed in opposing parallel relationship to corresponding faces of outer after-heater 18. From this position, pulling mechanism 26 may be extended, lowering stem 24 and seed assembly 22 toward die end face 32. Inasmuch as seed plates 68 are disposed to extend beyond the bottom of seed holder 56 by a distance greater than the height of inner after-heater 20, seed 58 will contact die end face 32 before seed holder 56 contacts insulation pad 54 atop the after-heater.

Seed 58 is now in position to initiate the growth sequence. If die end face 32 is heated above the melting point of the material of seed 58, the portion of the seed contacting the die end face will melt, wetting the end face and flowing into capillary gap 34. Pulling mechanism 26 may now be activated to raise stem 24 and the captivated seed assembly 22. As seed 58 rises from the die, the melted seed material wetting the die end face is drawn out, by surface tension, into a thin film between the seed and the die end face. Previously charged and melted charge 30 rises, by capillary action, to replenish the material wetting the die end face.

The portion of the liquid film nearest seed 58 is at a lower temperature than that at die end face 32, and begins to solidify as its temperature comes below the melting point. Thermal control of the film (and the growing crystal) is provided by after-heaters 18 and 20. In part, after-heaters 18 and 20 are heated by radiation from the growing crystal. Further, inner after-heater 20 receives radiation from the melt through aperture 39 in inner radiation shield 38. After-heaters 18 and 20 are also, in effect, susceptors, and are heated in part by radio-frequency radiation from coil 28. In addition to energy transfer by radiation, after-heaters 18 and 20 and seed 58 with the attached growing crystal are also cooled by convection. It will be understood by those skilled in the art that the vertical march of temperature within the space between after-heaters 18 and 20 may be controlled by such means as the disposition of after-heaters 18 and 20, the size of aperture 39, and the amount of insulation afforded by carbon felt walls 44 and 54. In particular, the decreasing clearance between tapered section 52 and the seed can be used to provide a growing zone of substantially constant temperature in the vicinity of die end face 32.

It has been found that a better quality silicon body may be formed by providing a suitable cooling gas, such as argon containing a small amount of oxygen, to the interior of the growing hollow polygonal prism. In part, the gas controls the rate of cooling of the growing crystal body, and in part the supply of gas to the interior of the body equalizes the interior pressure to the exterior pressure on the expanding hollow body. To convey the gas to the interior, bore 76 of stem 24 may be connected to a gas supply by a flexible conduit (not shown). Surplus gas is vented from the interior of the growing crystal structure through apertures 64 in seed holder 56 and apertures 78 in flange 74.

The invention has a number of advantages. Firstly, it will be appreciated that by allowing an initial seed to be fabricated from a number of flat plates the present seed holder overcomes the cost and overall size limitations previously set by boule size. Further, the structure of seed holder 56 and stem 24 allows downward motion of the stem relative to the seed. That is, after seed 58 contacts die end face 32, further downward motion of stem 24 results in relative motion between the stem and seed holder 56, flange 74 descending from counter bore 62. It will be understood that this prevents accidental damage to the seed due to its being forced into the die end face by a downward motion of the pulling mechanism. The structure of seed holder 56 and stem 24 also allows relative rotation about their vertical axes between seed holder and stem. This motion is useful both for initially aligning the seed with the capillary die and for reducing the deleterious effect of any rotational motion imparted by the pulling mechanism.

Figure 3:
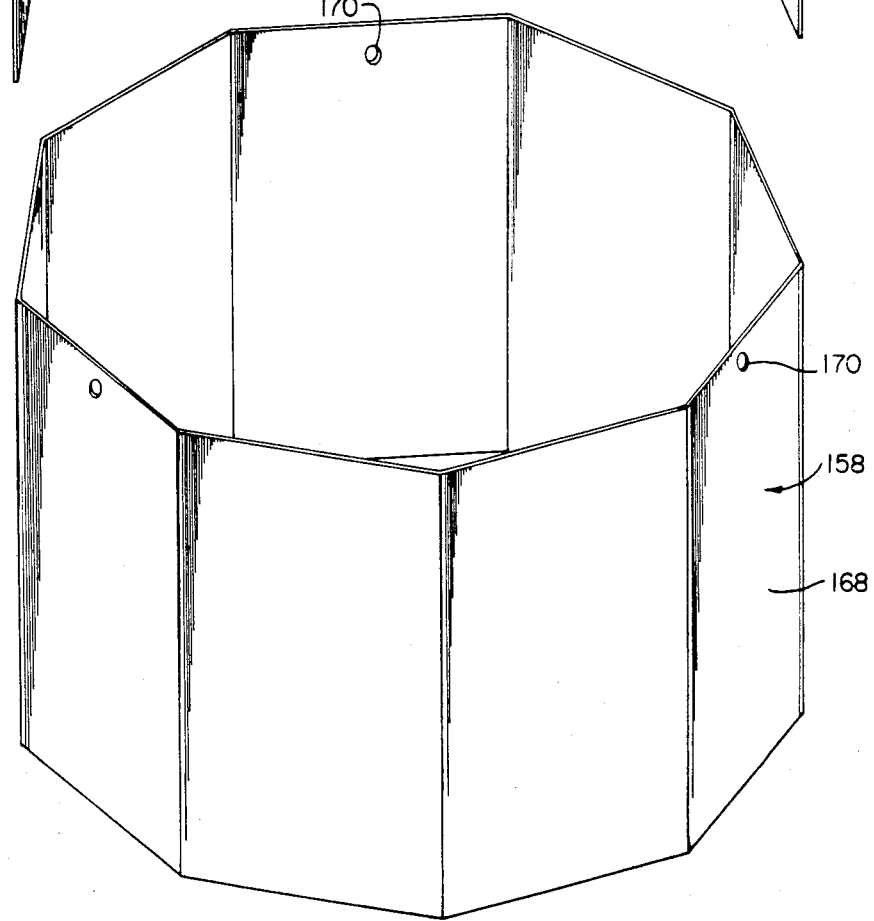
FIG. 3 is an integral seed, cut from a previous growth, suitable for use with the seed holder of FIG. 2.

It will be appreciated that the invention so far described may be modified without departing from the scope of the invention. Thus, the seed holder is adaptable for use with a single piece seed 158 as illustrated in FIG. 3. It will be understood that such a seed may be formed from a section of a crystal grown from the melt with the aid of, for instance, an initial seed 58. Inasmuch as each face 168 of seed 158 is an integral part of the whole seed, each face need not be constrained by a plurality of screws 72 as in the case of seed 58, and indeed only a few faces need contain apertures 170 for this purpose. In all other respects, however, seed 158 may be similar to seed 58.

It will further be understood that, if desired, the present invention may be modified to permit the growing of cylindrical bodies from the melt, the initial seed being in the shape of a multi-faceted polygon approximating, as closely as desired, the cylinder.

Since these and other changes may be made in the above described apparatus and process without departing from the scope of the invention herein involved, it is intended that all matter contained in the above description or shown in the accompanying drawings shall be interpreted in an illustrative and not a limiting sense.

What is claimed is:

1. Apparatus for use in growing thin-walled hollow tubular crystalline bodies from the melt employing a hollow elongate tubular seed, said apparatus comprising in combination:

a crucible suitable for containing a melt;
a capillary die at least partially disposed within said crucible, said capillary die having an end face in the form of a closed plane geometric figure and capillary means for feeding melt from said crucible to said end face;
means for (a) holding an elongate hollow tubular seed of predetermined cross-sectional configuration in contact with a film of melt on said end face, and (b) moving said seed vertically away from said end face;
an inner radiation shield disposed interior to said capillary die end face and supported so as to be clear of and confront any melt in said crucible, said inner radiation shield having a central aperture; and
a hollow tubular inner after heater dimensioned to be wholly contained within said tubular seed when said seed is in contact with a film of melt on said end face, said inner after heater being supported on said inner radiation shield and having an interior in communication with said crucible through said aperture in said inner radiation shield; and
a hollow tubular outer after heater surrounding and spaced from said inner after heater, said outer after heater being dimensioned so as to surround said seed when said seed is in contact with said film of melt.

2. Apparatus according to claim 1 wherein said inner after heater is supported on said inner radiation shield by way of a hollow conical frustum, the smaller diameter of said frustum being connected to said inner radiation shield.

3. Apparatus according to claim 1 wherein said inner radiation shield is supported by said crucible and is formed of a plurality of plates held together in parallel spaced apart opposing relationship.

4. Apparatus according to claim 1 for growing silicon bodies wherein said inner radiations shield is made of graphite.

5. Apparatus according to claim 1 wherein said inner after heater includes a top plate distal said central aperture.

6. Apparatus according to claim 5 wherein said inner after heater is made of graphite.

7. Apparatus accoring to claim 5 wherin an insulating pad overlies said top plate.

8. Apparatus according to claim 7 wherein said insulating pad is a carbon felt.

9. Apparatus for use in growing thin-walled hollow tubular crystalline bodies of silicon from the melt comprising in combination:

a crucible suitable for containing a melt of silicon;
a capillary die positioned at the upper end of said crucible, said capillary die having an end face with an annular configuration;
an inner radiation shield formed of a plurality of graphite plates held together in parallel spaced apart opposing relationship and having a central through aperture, said inner radiation shield being disposed interior to said end face clear of any melt in said crucible;
an elongate hollow tubular inner after heater, said inner after heater having an open end and a closed end and being supported on said inner radiation shield substantially concentrically within said capillary die, with said open end of said after heater directed toward said crucible, said inner after heater having a section substantially in the form of a hollow conical frustum connecting with said inner radiation shield, with the smaller diameter of said frustum substantially concentric and coplanar with said aperture, so that the interior of said inner after heater is in communication with the interior of said crucible through said aperture;
an elongate hollow tubular outer after heater surrounding and spaced from said inner after heater, said outer after heater being concentric with said end face;
an insulating pad of similar shape but smaller internal dimension than the transverse cross section of said inner after heater, said insulating pad being disposed substantially centrally said closed end of said inner after heater; and
means for supporting an elongate hollow seed in contact with said die end face and in confronting, spaced apart substantially coaxial relationship with said inner after heater and said outer after heater, said means for supporting including means for translating said seed substantially coaxially with said inner and outer after heaters.

10. Apparatus for use in growing thin-walled hollow tubular crystalline bodies from a melt of a selected material employing a hollow elongate tubular seed, said apparatus comprising in combination a crucible suitable for containing a melt of a selected material;
a capillary die having an end face defining an annular geometric shape and capillary means for feeding melt from said crucible to said end face;
a hollow tubular inner after heater;
an elongate, hollow, generally tubular seed having a cross-sectional configuration similar to said annular geometric shape; said seed having a length greater than said inner after heater;
pulling means including seed holding means for (a) holding said elongate hollow seed, (b) positioning said seed adjacent said end face, and (c) pulling said seed vertically away from said end face;
a radiation shield disposed interior to said end face and confronting the interior of said crucible, said radiation shield having a central aperture;
said hollow tubular inner after heater supported by said radiation shield, said inner after heater being sized so as to be surrounded by said elongate hollow seed when said seed is positioned adjacent to said end face; and
a hollow tubular outer after heater concentric with and surrounding said first after heater, said after heater being supported by said crucible.

11. Apparatus according to claim 10 further including an outer radiation shield surrounding said end face of said die and located below said outer after heater.

12. Apparatus according to claim 11 wherein said outer radiation shield is supported by susceptor means surrounding said crucible.

13. Apparatus according to claim 12 wherein said seed is in the form of a plurality of substantially flat plates held in abutting relationship with one another and arranged in a circular array.

* * * * *